US011536303B2

(12) United States Patent
Galdos et al.

(10) Patent No.: US 11,536,303 B2
(45) Date of Patent: Dec. 27, 2022

(54) COUPLING ELEMENT FOR A POSITIONING DEVICE, POSITIONING DEVICE HAVING A COUPLING ELEMENT, AND METHOD OF MANUFACTURE

(71) Applicant: ETEL S.A., Motiers (CH)

(72) Inventors: Gorka Galdos, Couvet (CH); Philippe Tamigniaux, Morteau (FR); Pierre-Andre Zanoni, Yverdon-les-Bains (CH); Jean-Yves Bordas, Doubs (FR)

(73) Assignee: ETEL S.A., Motiers (CH)

( * ) Notice: Subject to any disclaimer, the term of this patent is extended or adjusted under 35 U.S.C. 154(b) by 355 days.

(21) Appl. No.: 16/850,019

(22) Filed: Apr. 16, 2020

(65) Prior Publication Data

US 2020/0340509 A1    Oct. 29, 2020

(30) Foreign Application Priority Data

Apr. 24, 2019 (EP) .................................... 19170813

(51) Int. Cl.
*F16C 29/02* (2006.01)
*F16B 5/02* (2006.01)
(Continued)

(52) U.S. Cl.
CPC ............. *F16B 5/0225* (2013.01); *B25J 9/10* (2013.01); *F16C 11/12* (2013.01); *F16C 29/02* (2013.01)

(58) Field of Classification Search
CPC ......... F16C 11/12; F16C 29/01; F16C 29/02; F16B 5/0225; B25J 9/10; F16F 1/18
See application file for complete search history.

(56) References Cited

U.S. PATENT DOCUMENTS 3,465,997 A * 9/1969 Piske ...................... F16C 11/12
                                                      248/619
4,261,211 A * 4/1981 Haberland .............. F16D 3/005
                                                      403/291
(Continued)

FOREIGN PATENT DOCUMENTS

CN     100468598 C  *  3/2009
EP        1420179 A1     5/2004
(Continued)

*Primary Examiner* — William C Joyce
(74) *Attorney, Agent, or Firm* — Leydig, Voit & Mayer, Ltd.

(57) ABSTRACT

A coupling element for a positioning device, which includes a first and second linear guides for guiding first and second carriages respectively along first and second linear directions, is configured to create a coupling between the first carriage and the second linear guide. The coupling element includes a central part and a surrounding part spaced at a distance therefrom. The surrounding part has a central portion surrounding the central part, and has two end portions adjoining the central portion in the first linear direction. Connecting flat springs are disposed to create the distance and connect together the central part and the central portion of the surrounding part. The connecting flat springs lie in planes which intersect at a center of the central part. A vertical flat spring is disposed parallel to the first linear direction at each of the two end portions of the surrounding part.

18 Claims, 8 Drawing Sheets

(51) Int. Cl.
*B25J 9/10* (2006.01)
*F16C 11/12* (2006.01)

(56) References Cited

U.S. PATENT DOCUMENTS

| | | | | | |
|---|---|---|---|---|---|
| 4,533,100 | A | * | 8/1985 | Paseri | B64G 1/66 244/173.1 |
| 4,559,717 | A | * | 12/1985 | Scire | G01B 5/0004 33/1 M |
| 4,997,158 | A | * | 3/1991 | James | G12B 5/00 248/593 |
| 5,529,277 | A | * | 6/1996 | Ostaszewski | F16M 11/2021 248/629 |
| 5,692,728 | A | * | 12/1997 | Shiozawa | B23Q 11/0032 248/618 |
| 7,093,827 | B2 | * | 8/2006 | Culpepper | F16C 11/12 310/309 |
| 7,270,319 | B2 | * | 9/2007 | Culpepper | F16C 11/12 310/309 |
| 7,493,864 | B2 | | 2/2009 | Corpelet | |
| 8,040,099 | B2 | | 10/2011 | Coleman | |
| 2003/0086751 | A1 | * | 5/2003 | Culpepper | F16C 11/12 403/52 |
| 2004/0094882 | A1 | | 5/2004 | Coppoolse | |
| 2006/0252297 | A1 | * | 11/2006 | Culpepper | F16C 11/12 439/374 |
| 2008/0216286 | A1 | | 9/2008 | Bertele et al. | |
| 2019/0094714 | A1 | * | 3/2019 | Yang | G03F 7/70758 |

FOREIGN PATENT DOCUMENTS

| | | |
|---|---|---|
| EP | 1810776 A1 | 7/2007 |
| EP | 2066996 B1 | 8/2012 |
| FR | 2861715 A1 | 5/2005 |

\* cited by examiner

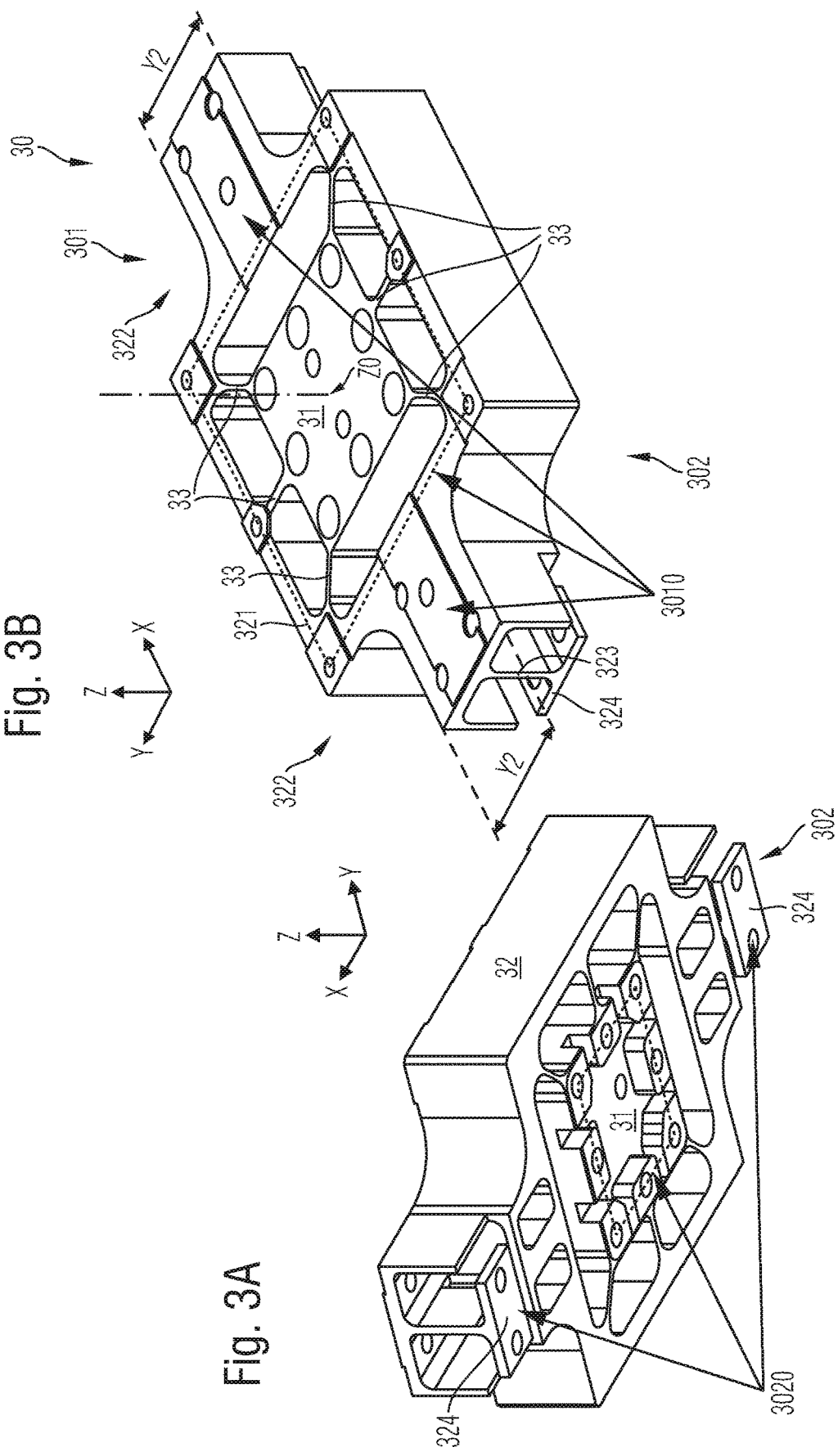

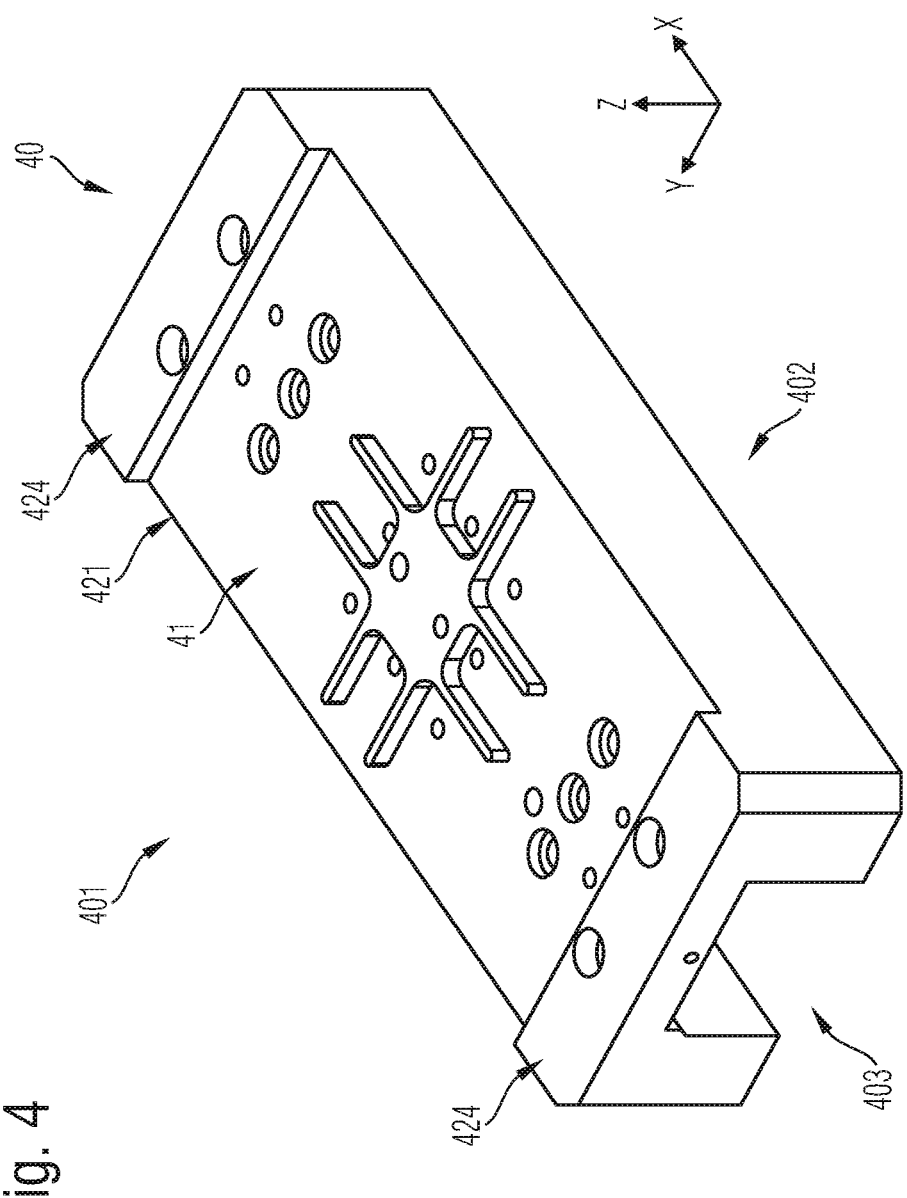

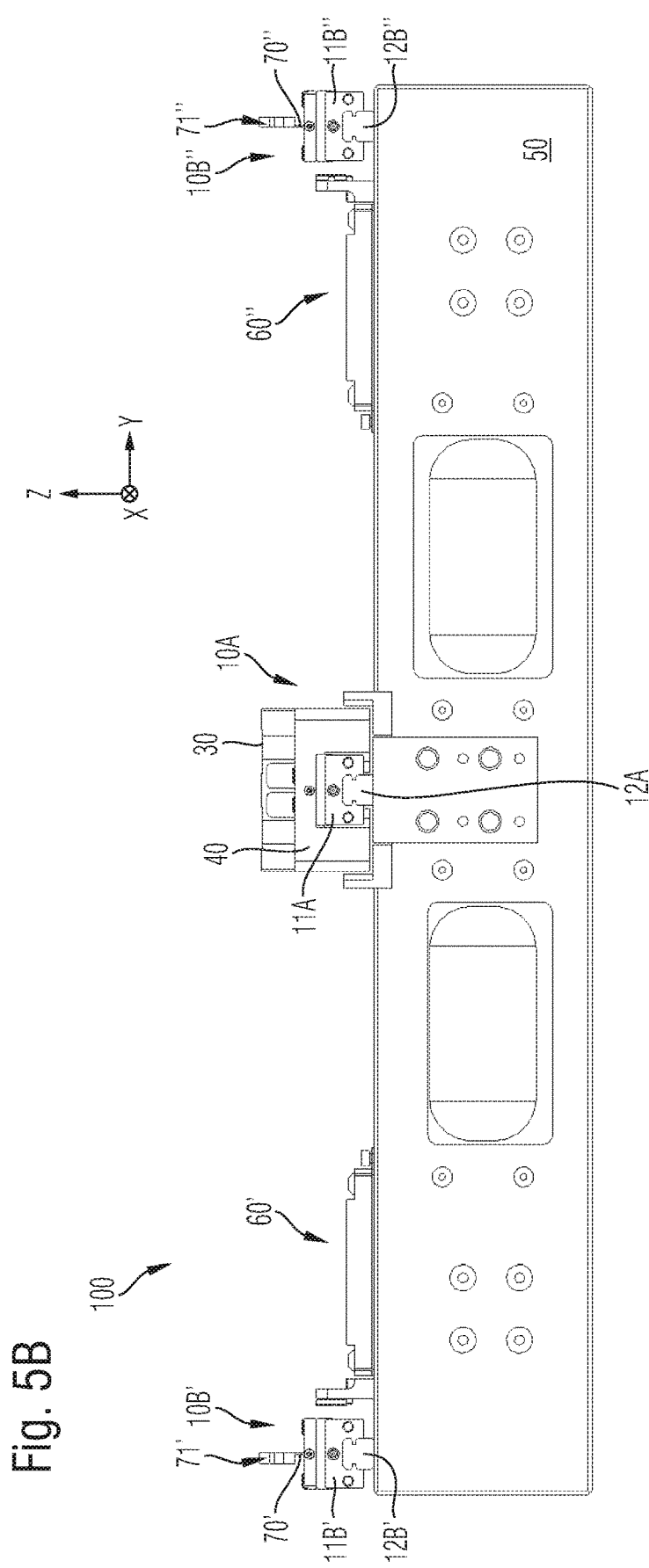

COUPLING ELEMENT FOR A POSITIONING DEVICE, POSITIONING DEVICE HAVING A COUPLING ELEMENT, AND METHOD OF MANUFACTURE

CROSS-REFERENCE TO PRIOR APPLICATIONS

Priority is claimed to European Patent Application No. EP 19 170 813.0, filed on Apr. 24, 2019, the entire disclosure of which is hereby incorporated by reference herein.

FIELD

This document relates to embodiments of a coupling element for a positioning device, in particular a gantry-type positioning device (also known as a "gantry system") such as an X-Y table, embodiments of a positioning device having a coupling element, and to embodiments of a method for manufacturing a coupling element for a positioning device.

BACKGROUND

In an exemplary positioning device, in particular a gantry-type positioning device such as described in EP 2 066 996 B1, a cross member is movably supported between two (or more) parallel linear guides, and a functional element is movably supported on the cross member by means of a further linear guide, so that this functional element can be freely positioned in a plane between the two parallel linear guides (which is also known as an H-gantry).

Depending on the particular application, the functional element may be, for example, a gripper of a pick-and-place machine, a microscope, a laser of a laser-machining center or also a touch probe of a coordinate measuring machine. Many other applications are known in the art.

In all these applications, of which there are still more for positioning devices, the most precise possible positioning of the functional element plays an important role. Therefore, great effort is sometimes expended to position the functional element as accurately as possible using the most precise position-measuring devices possible, as described in more detail, for example, in EP 2 066 996 B1.

However, not only accurate position measurement, but also the design of the coupling between the linear guides that are perpendicular to each other can be important for precise positioning. Depending on the stiffness of the relevant components, accelerations in the mutually perpendicular directions may cause the functional element or the linear guide carrying the same to tilt, for example, about the Y-axis in response to an acceleration (including braking) along the X-axis, but also about the Z-axis, for example, if the two (or more) parallel linear guides carrying the cross member are not moved exactly synchronously in the X-direction.

Sometimes, it is desired to permit the cross member carrying the functional element to tilt to a limited extent about vertical Z-axis because exactly synchronous operation of the two (or more) parallel linear guides carrying the cross member may not be guaranteed at all times, and specifically, for example, because of a desired slight tilting of the functional element as set forth in paragraph [0040] of EP 2 066 996 B1.

In contrast, other tilting movements are usually undesirable because they make precise positioning of the functional element more difficult.

SUMMARY

In an embodiment, the present invention provides a coupling element for a positioning device, the positioning device including a first linear guide for guiding a first carriage along a first linear direction and a second linear guide for guiding a second carriage along a second linear direction substantially perpendicular to the first linear direction. The coupling element is configured to create a coupling between the first carriage and the second linear guide. The coupling element includes a central part and a surrounding part spaced at a distance from and surrounding the central part. The surrounding part has a central portion surrounding the central part, and has two end portions adjoining the central portion in the first linear direction. A plurality of connecting flat springs are disposed to create the distance and connect together the central part and the central portion of the surrounding part. The connecting flat springs lie in planes which intersect at a center of the central part. A vertical flat spring is disposed parallel to the first linear direction at each of the two end portions of the surrounding part.

BRIEF DESCRIPTION OF THE DRAWINGS

Embodiments of the present invention will be described in even greater detail below based on the exemplary figures. The present invention is not limited to the exemplary embodiments. All features described and/or illustrated herein can be used alone or combined in different combinations in embodiments of the present invention. The features and advantages of various embodiments of the present invention will become apparent by reading the following detailed description with reference to the attached drawings which illustrate the following:

FIG. 3A exemplarily and schematically shows a detail of a perspective view of a coupling element in accordance with one or more embodiments;

FIG. 3B exemplarily and schematically shows a detail of a perspective view of a coupling element in accordance with one or more embodiments;

FIG. 4 exemplarily and schematically shows a detail of a perspective view of a receiving element in accordance with one or more embodiments;

FIG. 5B exemplarily and schematically shows a detail of a cross-sectional view of a positioning device in accordance with one or more embodiments;

DETAILED DESCRIPTION

Figure 1:
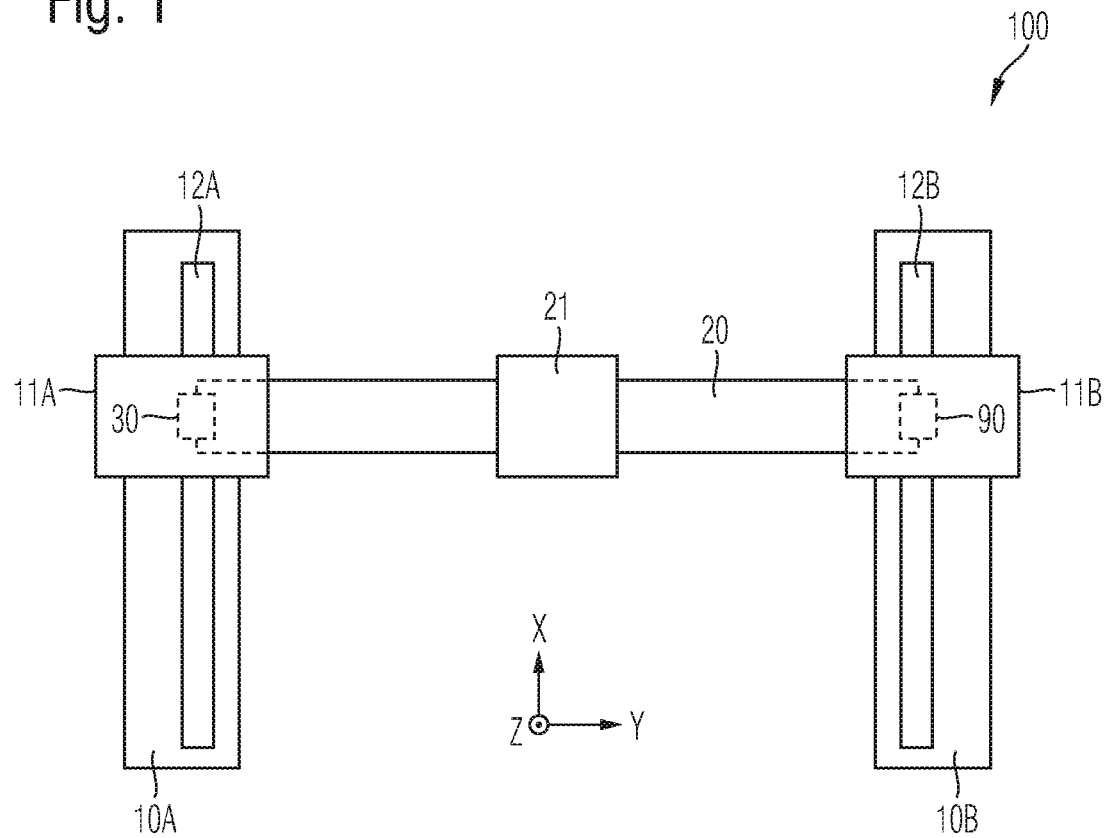
FIG. 1 exemplarily and schematically shows a detail of a plan view of a positioning device in accordance with one or more embodiments.

An embodiment of the present invention provides a coupling element for a positioning device, in particular a gantry-type positioning device (also known as a "gantry system") such as an X-Y table, which has improved stiffness characteristics with respect to desirable and undesirable tilting.

Other embodiments of the present invention provide a corresponding positioning device and a corresponding method of manufacture.

A first embodiment provides a coupling element for a positioning device including a first linear guide for guiding a first carriage along a first linear direction, as well as a second linear guide for guiding a second carriage along a second linear direction substantially perpendicular to the first linear direction. The coupling element is configured to create a coupling between the first carriage and the second linear guide. The coupling element includes a central part; a surrounding part spaced at a distance from and surrounding the central part, the surrounding part having a central portion surrounding the central part, as well as two end portions adjoining the central portion in the first linear direction; a plurality of connecting flat springs creating the distance and connecting together the central part and the central portion of the surrounding part, the planes in which the connecting flat springs lie intersecting at a center of the central part; and, at each of the two end portions of the surrounding part, a vertical flat spring disposed parallel to the first linear direction.

In accordance with a second embodiment, a positioning device includes a first linear guide for guiding a first carriage along a first linear direction; a second linear guide for guiding a second carriage along a second linear direction substantially perpendicular to the first linear direction; and a coupling element configured to create a coupling between the first carriage and the second linear guide. The coupling element includes a central part; a surrounding part spaced at a distance from and surrounding the central part, the surrounding part having a central portion surrounding the central part, as well as two end portions adjoining the central portion in the first linear direction; a plurality of connecting flat springs creating the distance and connecting together the central part and the central portion of the surrounding part, the planes in which the connecting flat springs lie intersecting at a center of the central part; and, at each of the two end portions of the surrounding part, a vertical flat spring disposed parallel to the first linear direction.

A third embodiment provides a method for manufacturing a coupling element for a positioning device. The positioning device includes a first linear guide for guiding a first carriage along a first linear direction, as well as a second linear guide for guiding a second carriage along a second linear direction substantially perpendicular to the first linear direction. The method includes: manufacturing, as a single piece, a central part; a surrounding part spaced at a distance from and surrounding the central part, the surrounding part having a central portion surrounding the central part, as well as two end portions adjoining the central portion in the first linear direction; a plurality of connecting flat springs creating the distance and connecting together the central part and the central portion of the surrounding part, the planes in which the connecting flat springs lie intersecting at a center of the central part; and, at each of the two end portions of the surrounding part, a vertical flat spring disposed parallel to the first linear direction.

In the following, reference is made to all of the aforementioned embodiments. Different features described below can be used in the first, second and third embodiments, and in other embodiments of the present invention.

Due to the design of the coupling element, high stiffness is achieved, particularly with respect to a generally undesirable tilting about the second linear direction. In contrast, a generally desirable tilting about a third linear direction perpendicular to both the first linear direction and the second linear direction (i.e., for example, a vertical direction) is possible to a certain extent, as will be described in more detail elsewhere herein.

The positioning device in which the coupling device may be used is configured as, for example, a gantry-type positioning device (also known as a "gantry system"). For example, the positioning device is what is referred to as an X-Y table or what is referred to as an H-gantry.

The first linear guide guides the second linear guide along the first linear direction, typically by means of a suitably configured electric drive. As will be discussed in greater detail with reference to the exemplary embodiments shown in the figures, the positioning device may also include a plurality of first linear guides.

The second linear guide guides the second carriage along the second linear direction substantially perpendicularly to the first linear direction. The second linear guide is configured as, for example, a cross member that is disposed above the first linear guide(s) and connected to the first carriage, for example, in such a manner that it bridges the first linear guide(s), thereby forming the aforesaid H-gantry. In order to guide the second carriage, the second linear guide typically includes a suitably configured electric drive.

The second carriage may have mounted thereon a functional element, for example in the form of a pick-up-and place device, a microscope, a laser, etc. Positioning devices of the aforementioned type are used in a wide field of applications, and thus, the functional element may be embodied in a correspondingly large number of different ways. The embodiments described herein are not limited to a particular application. Moreover, the functional element may be equipped with an additional electric drive capable of guiding a guide of a functional unit (e.g., a pick-and-place head, a gripper or the like) along another direction, for example the third linear direction.

The coupling element is configured to create the coupling between the first carriage (which is guided by the first linear guide) and the second linear guide. The second linear guide can be moved along the first linear direction by means of the first carriage, and the coupling required for this purpose between the second linear guide and the first carriage is created in particular by the coupling element.

In an embodiment, the coupling element is mounted to the second linear guide. The first carriage may have a receiving element mounted thereon which, in this embodiment, is configured to receive the coupling element. Alternatively, the coupling element is mounted to the first carriage directly; i.e., without an additional receiving element.

In an embodiment of the positioning device, both the central part and the surrounding part of the coupling element are mounted to the receiving element (which is mounted to the carriage). However, only the surrounding part, but not the central part, is mounted to the second linear guide.

The surrounding part can be spatially divided into a central portion surrounding the central part, as well as two end portions adjoining the central portion in the first linear direction, which end portions may be reduced in width in the second linear direction as compared to the central portion.

The central portion may extend mirror-symmetrically about the central part (with respect to the third linear direction) and may be connected thereto via the connecting flat springs. The two end portions extend seamlessly from the central portion in the first linear direction and a direction opposite thereto, respectively, and have, for example, an extent in the second linear direction that is reduced, e.g., by a factor of at least two, as compared to the second overall extent of the surrounding part. The surrounding part, including its two end portions, may be configured mirror-symmetrically with respect to the second linear direction.

In an embodiment, the surrounding part has a first overall extent in the first linear direction that is greater than its second overall extent in the second linear direction. This geometry makes it easier to dispose the vertical flat springs at suitable locations further away from the center of the central part than the connecting flat springs, as will be described in more detail below. Thus, tilting/rotation about the second linear direction (as an axis of rotation), which may be caused by accelerations along the first linear direction (resulting from a corresponding movement of the first carriage), can be dampened or completely avoided.

The first overall extent in the first linear direction, which is greater than the second overall extent in the second linear direction, is obtained, for example, by the two adjoining end portions of the surrounding part. As just mentioned, the end portions may, in addition, be reduced in width in the second linear direction as compared to the central portion.

The first overall extent of the coupling element in the first linear direction is, for example, 1.5 times greater than the second overall extent in the second linear direction. The first overall extent may even be at least twice as great as the second overall extent.

The plurality of connecting flat springs, which create the distance between the central part and the surrounding part and connect these two parts of the coupling element together, permit a certain degree of tilting about the third linear direction (as an axis of rotation). The extent to which tilting about this axis is possible can be determined by suitable dimensioning of the connecting flat springs.

It is also within the scope of an embodiment of the present invention that the two end portions of the surrounding part be tiltable about the third linear direction (as an axis of rotation). This is achieved, for example, by providing each of the two end portions with a vertical flat spring disposed parallel to the first linear direction.

The vertical flat springs extend, for example, from a top side of the coupling element to a bottom side of the coupling element and merge, at the bottom side, into a respective web-like flange forming a respective portion of the mounting surface at the bottom side, which portion is isolated from the remainder of the bottom side of the coupling element and, for example, —like the bottom side—extends in a plane parallel to the first and second linear directions.

In accordance with an embodiment, each of the connecting flat springs is disposed in a plane parallel to the third linear direction. In other words, the normal of each of the connecting flat springs is perpendicular to the third linear direction. The same holds true for the vertical flat springs.

In accordance with an embodiment, the connecting flat springs are arranged in a star pattern such that the planes in which the connecting flat springs lie intersect at a center of the central part. This is achieved, for example, in that each of the planes in which the connecting flat springs lie is disposed at an angle of either 45° or 90° with respect to the first linear direction so that, in particular, none of the connecting flat springs is disposed in a plane parallel to the first linear direction. However, the vertical flat springs are disposed in these planes parallel to the first linear direction. The planes in which the vertical flat springs lie also intersect at the center of the central part.

In accordance with an embodiment, the connecting flat springs are spaced a minimum distance from one another, for example, a distance of at least 45° with respect to the axis of rotation extending through the center and parallel to the third linear direction.

In accordance with an embodiment, each of both the connecting flat springs and the vertical flat springs is formed as a separate flat spring.

The connecting flat springs and the vertical flat springs are preferably configured to allow the surrounding part to tilt about an axis of rotation extending through the center of the central part and parallel to the third linear direction. To this end, the planes in which the vertical flat springs lie intersect at the center of the central part. The extent to which tilting is to be permitted can be determined by suitable dimensioning of the flat springs. When the present description speaks of a distance from the center of the central part, this means a distance extending parallel to a plane defined by the first and second linear directions. Thus, the aforesaid distance may in particular be a distance from the axis of rotation extending through the center of the central part and parallel to the third linear direction.

The spaced-apart connecting flat springs divide the volume between the central part and the surrounding part into sections. In accordance with an embodiment, these sections are formed as empty spaces, whereby the coupling element has a low weight.

The distance between the central part and the surrounding part is, for example, at least several millimeters, for example, about 10 mm, and, in one embodiment, 12.5 mm. This distance may be the same in both linear directions X and Y. The connecting flat springs creating this distance are dimensioned accordingly. It should be emphasized at this point that the connecting flat springs do not necessarily need to have a constant thickness along the distance, but that this thickness may vary along the distance. Also, the connecting flat springs need not all be configured identically, but may have different thicknesses, depending on the desired stiffness characteristic of the coupling element.

In accordance with another embodiment, the coupling element is configured such that a distance between the two vertical flat springs along the first linear direction is greater than the distance between any two opposite connecting flat springs. In this embodiment, the vertical flat springs are a factor of at least two further away from the center of the central part than any of the connecting flat springs. Since the two vertical flat springs are disposed in this way at a relatively great distance from the center of the central part, they give the coupling element high stiffness with respect to tilting/rotation about the second linear direction (as an axis of rotation).

In accordance with an embodiment, the coupling element is monolithically formed, for example, of a stainless steel. Thus, in accordance with an embodiment, the surrounding part, the central part, as well as the connecting flat springs connecting these parts are made from one piece of material, for example, from one piece of stainless steel.

For example, a mounting surface at the top side of the coupling element is configured for coupling to the second linear guide, it being possible that only the surrounding part, but not the central part, is mounted to the second linear guide.

A mounting surface at the bottom side of the coupling element may be configured for coupling to the first carriage, it being possible that both the central part and the surrounding part are mounted to the first carriage (e.g., via the aforesaid receiving element). In particular, the web-like flanges may form respective portions of the mounting surface at the bottom side, and may be mounted to the receiving element and thus to the first carriage. This facilitates, to a certain extent, rotation/tilting about the third linear direction (as an axis or rotation).

In accordance with an embodiment, the top side and the bottom side each extend parallel to both the first and second linear directions.

In accordance with an embodiment, the distance between the central part and the surrounding part along the first linear direction is greater than the distance between these two parts in the second linear direction.

As mentioned, the positioning device may be a gantry-type design, which may be implemented in many different ways. For example, the positioning device may have two first linear guides that are disposed parallel to each other and each guide a respective first carriage. Each of the two first carriages may have mounted thereon a respective coupling element according to any of the above-described embodiments, creating a coupling to the second linear guide.

In accordance with another embodiment, the positioning device includes two (or more than two) outer linear guides that are disposed adjacent and parallel to the first linear guide and each guide at least one auxiliary carriage along the first linear direction, the second linear guide being coupled (via the coupling element) to the first carriage and also to the two auxiliary carriages. In order to create the coupling between the second linear guide and the two auxiliary carriages, each of the two auxiliary carriages may have a respective coupling flat spring mounted thereon, each coupling flat spring being disposed in a plane parallel to the first linear direction and to the third linear direction. These coupling flat springs, too, permit a certain degree of tilting/rotation about the third linear direction (as an axis of rotation), but prevent tilting/rotation about the first linear direction (as an axis of rotation) and about the second linear direction (as an axis of rotation).

Provided herein as embodiments of the present invention are not only the coupling element and the positioning device equipped with the coupling element, but also a method for manufacturing a coupling element. The method includes: manufacturing, as a single piece, a central part; a surrounding part spaced at a distance from and surrounding the central part, the surrounding part having a central portion surrounding the central part, as well as two end portions adjoining the central portion in the first linear direction; a plurality of connecting flat springs creating the distance and connecting together the central part and the central portion of the surrounding part, the planes in which the connecting flat springs lie intersecting at a center of the central part; and, at each of the two end portions of the surrounding part, a vertical flat spring disposed parallel to the first linear direction.

Exemplary embodiments of the method for manufacturing the coupling element correspond to the above-described embodiments of the coupling element and the above-described embodiments of the positioning device, and therefore, reference is made to the above description.

The manufacture includes, for example, several machining steps, such as a punching step, a milling step, and the like. In order to configure the coupling element for creating the coupling between the first carriage and the second linear guide, the method further includes, for example, forming openings in the surrounding part and in the central part, which openings may be engaged by fasteners from the side facing the second linear guide and from the side facing the first carriage so as to form the aforesaid coupling.

FIG. 1 shows exemplarily and schematically a positioning device 100. Positioning device 100 is a gantry-type design and includes two first linear guides 10A and 10B.

Each of the two first linear guides 10A and 10B guides a respective first carriage 11A or 11B along a first linear direction X. To provide for such guidance, a respective guide rail or guide groove or other guide means 12A or 12B may be provided.

Positioning device 100 further includes a second linear guide 20 that guides a second carriage 21 along a second linear direction Y substantially perpendicular to first linear direction X.

Second linear guide 20 is coupled to the two first carriages 11A, 11B and thus is movable along first linear direction X. In order to produce movement in first and second linear directions X and Y, corresponding electric drives are provided.

Thus, second linear guide 20 is configured, for example, as a cross member disposed above first linear guides 10A, 10B (considered with respect to a third linear direction Z perpendicular to first and second linear directions X, Y).

Figure 2:
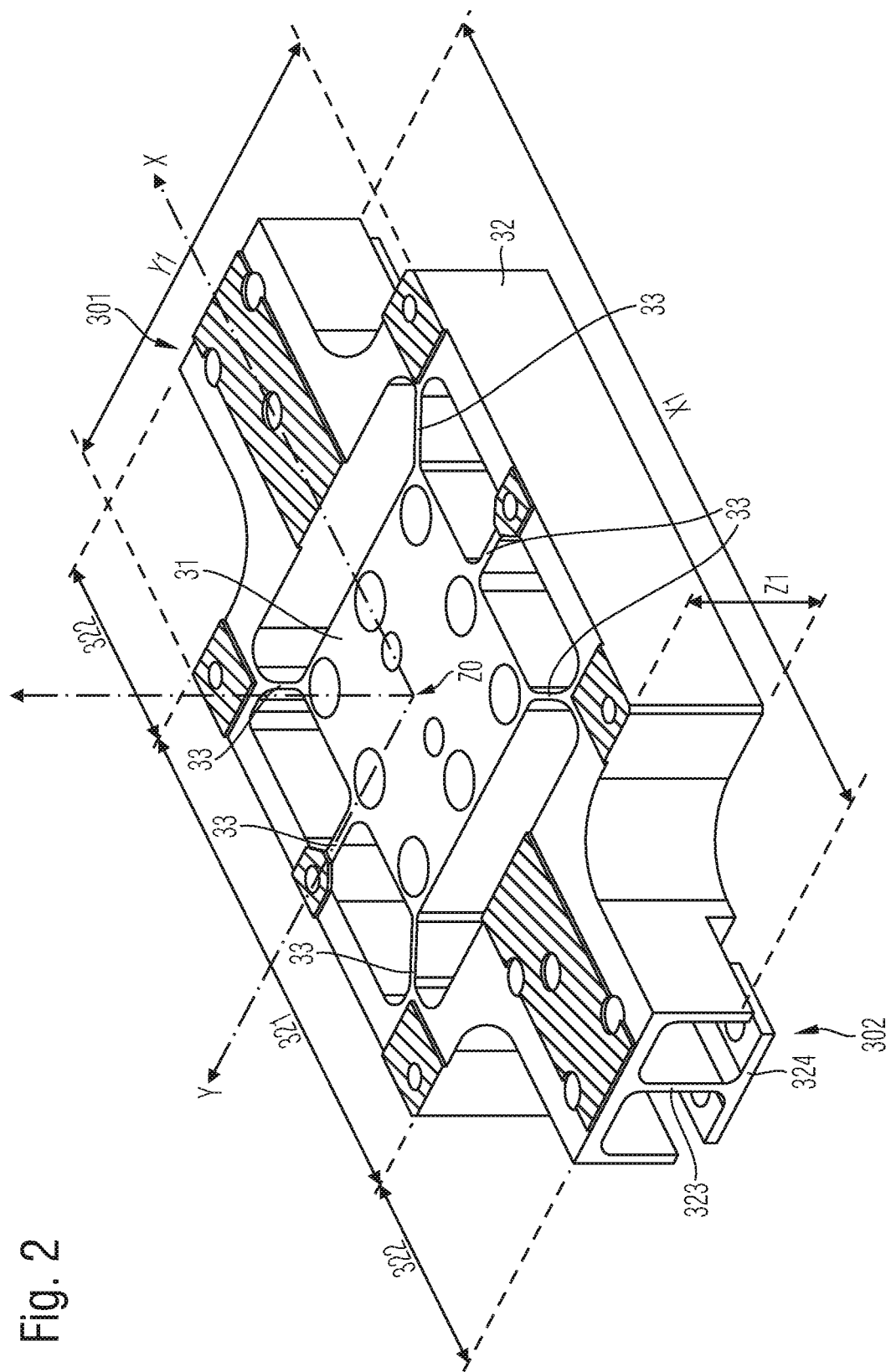
FIG. 2 exemplarily and schematically shows a detail of a perspective view of a coupling element in accordance with one or more embodiments.
Figure 5A:
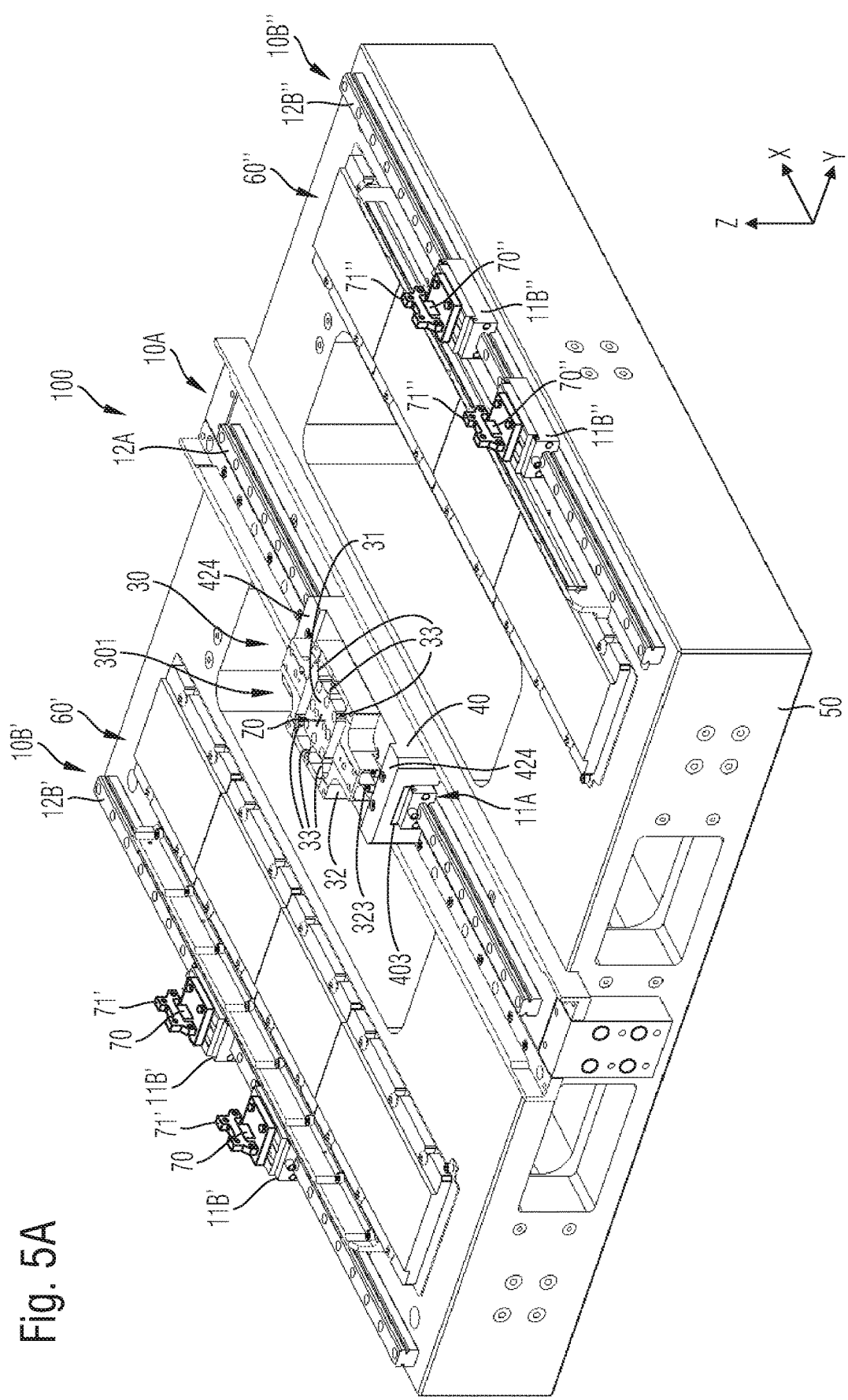
FIG. 5A exemplarily and schematically shows a detail of a perspective view of a positioning device in accordance with one or more embodiments.
Figure 5C:
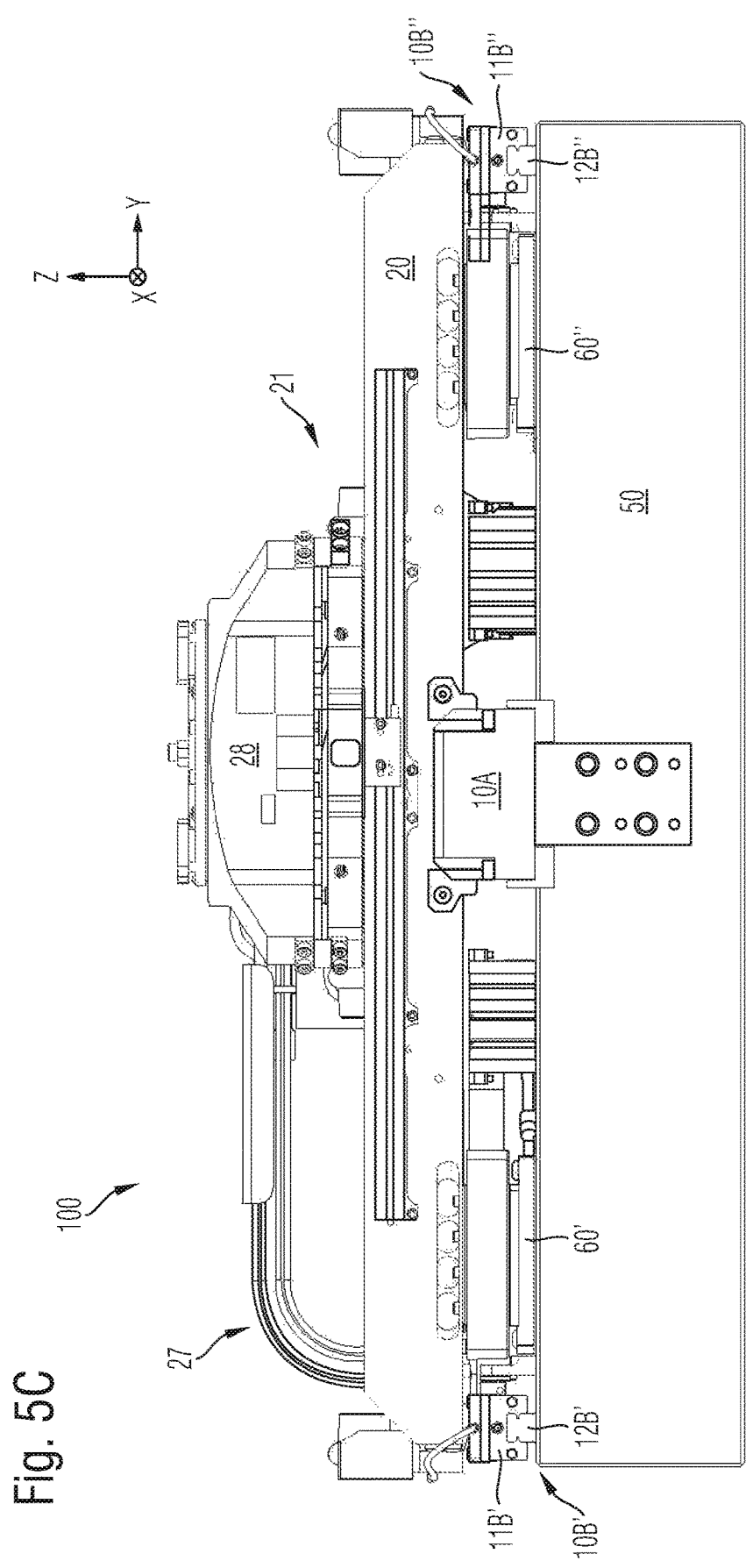
FIG. 5C exemplarily and schematically shows a detail of a cross-sectional view of a positioning device in accordance with one or more embodiments and FIG. 6 exemplarily and schematically shows a detail of a perspective view of an auxiliary carriage in accordance with one or more embodiments.

In order to create the coupling between second linear guide 20 and first carriage 11A, a coupling element 30 is provided, shown in FIG. 2. FIGS. 5A-C show schematically and exemplarily the disposition of coupling element 30 in another embodiment of positioning device 100. In the following, reference will also be made to these FIGS. 5A-C.

Coupling element 30 has a top side 301 and a bottom side 302. Top side 301 is mounted to second linear guide 20, and bottom side 302 is mounted to first carriage 11A.

In the following, reference is always made to this first carriage 11A, although in other embodiments, an additional coupling element 90 may be provided that creates the coupling between second linear guide 20 and additional carriage 11B, which is guided in first linear direction X, as schematically illustrated in FIG. 1. This additional coupling element 90 may in particular be configured as a coupling flat spring (i.e., differently than coupling element 30), as will be explained in more detail with reference to FIGS. 5A-C and FIG. 6.

The coupling element includes a central part 31 surrounded by a surrounding part 32. Surrounding part 32 is spaced at a distance from central part 31. A plurality of connecting flat springs 33 creating this distance connect central part 31 and surrounding part 32 together.

Coupling element 30 is configured such that it permits a certain degree of tilting/rotation about third linear direction Z (as an axis of rotation through center Z0 of central part 31), but substantially or completely prevents rotation about first linear direction X (as an axis of rotation) and particularly about second linear direction Y (as an axis of rotation).

Surrounding part 32 has a first overall extent X1 in first linear direction X and a second overall extent Y1 in second linear direction Y. Second overall extent Y1 may be less than first overall extent X1. First overall extent X1 is, for example, 1.5 times greater than second overall extent Y1, or even at least twice as great.

As illustrated in FIG. 2, surrounding part 32 is divided into a central portion 321 surrounding central part 31, as well as two end portions 322 adjoining central portion 321 in first linear direction X. First overall extent X1, which is greater than second overall extent Y1, is obtained in particular by these end portions 322.

Second overall extent Y1 of surrounding part 32 is defined by the overall extent of central portion 321 in second linear direction Y. The two end portions 322 may be reduced in width as compared to this second overall extent Y1 and have a shorter extent Y2 (see FIG. 3B). This aspect of the embodiment of coupling element 30 will be discussed in more detail later herein.

Coupling element 30 may be monolithically formed, for example of a stainless steel. Thus, in particular, central part 31, surrounding part 32 and connecting flat springs 33 are formed integrally as a single piece. Consequently, the two end portions 322 seamlessly adjoin central portion 321.

While, as explained above, tilting/rotation about second linear direction Y (as an axis of rotation) is undesirable, tilting/rotation about third linear direction Z (as an axis of rotation) may be desirable to a certain extent. For this purpose, each of connecting flat springs 33 is disposed in a plane parallel to third linear direction Z. As illustrated, connecting flat springs 33 are arranged in a star pattern, for example, in that each of the planes in which connecting flat springs 33 lie is disposed at an angle of either 45° or 90° with respect to first linear direction X. The planes in which connecting flat springs 33 lie intersect at a center Z0 of central part 31. An axis extending parallel to third linear direction Z and through this center Z0 of central part 31 forms the axis of rotation of coupling element 30 (with respect to rotation about third linear direction Z).

In the exemplary embodiments illustrated in the drawings, a total of six connecting flat springs 33 are provided to connect central part 31 to surrounding part 32, the connecting flat springs extending at an angle of 45° or 90° to first linear direction X. However, between central part 31 and surrounding part 32, no connecting flat springs are provided that would extend parallel to first linear direction X. Instead, end portions 322 are provided with vertical flat springs 323 extending along third linear direction Z from top side 301 to bottom side 302, where they merge into a respective web-like flange 324. Thus, the distance between these two vertical flat springs 323 is significantly greater than the distance between two connecting flat springs 33 disposed diametrically opposite each other (i.e., offset 180° from each other).

The planes in which vertical flat springs 323 lie also intersect at center Z0 of central part 31.

Connecting flat springs 33 and vertical flat springs 323 are configured to allow surrounding part 32 to tilt about an axis of rotation extending through center Z0 of central part 31 and parallel to third linear direction Z, or, in short, to allow surrounding part 32 to tilt about third linear direction Z (as an axis of rotation). At the same time, the distance between the two vertical flat springs 323 along first linear direction X is greater than the distance between any two opposite connecting flat springs 33. More specifically, vertical flat springs 323 are further away from center Z0 of central part 31 than any of the connecting flat springs 33.

For example, vertical flat springs 323 are each at least 1.5 times or at least two times further away from center Z0 of central part 31 than any of the connecting flat springs 33. All of the connecting flat springs 33 may be spaced the same distance from center Z0 of central part 31.

Thus, flat springs 33 and 323 are configured to substantially or completely prevent tilting/rotation about second linear direction Y (as an axis of rotation), but to permit a certain degree of tilting/rotation about third linear direction Z (as an axis of rotation). The extent to which tilting/rotation about this axis is permitted can be determined by suitable dimensioning of flat springs 33 and 323.

Furthermore, in particular because of the configuration and arrangement of connecting flat springs 33, coupling element 30 is configured such that tilting/rotation about first linear direction X (as an axis of rotation) is also substantially or completely prevented. However, due to the high acceleration forces acting parallel to first linear direction X and because second linear guide 20 is disposed above first linear guides 10A, 10B' and 10B", the loads related to tilting/rotation about second linear direction Y are relatively high, and thus higher stiffness is desired with respect to tilting/rotation about this second linear direction Y (as an axis of rotation). More specifically, in accordance with an embodiment of coupling element 30, the stiffness with respect to tilting/rotation about second linear direction Y (as an axis of rotation) may be greater than the stiffness with respect to tilting/rotation about first linear direction X (as an axis of rotation).

As illustrated, connecting flat springs 33 define sections of the volume between central part 31 and surrounding part 32. These sections are formed as empty spaces and thus also permit tilting/rotation about third linear direction Z (as an axis of rotation).

The two end portions 322 of surrounding part 32 may be tiltable relative to central part 31 about third linear direction Z (as an axis of rotation). For example, as illustrated, web-like flanges 324 are isolated from the remainder of bottom side 302 and also from a side wall extending from top side 301 to bottom side 302.

The thicknesses of flat springs 33 and 323 may be dimensioned according to the desired stiffness of coupling element 30. For example, it is within the scope of the present invention that the thicknesses of connecting flat springs 33 may differ and/or that the thickness of any one of the connecting flat springs 33 may vary along the distance between central part 31 and surrounding part 32.

Referring to FIGS. 3A, 3B, 4 and 5A-C, an exemplary installation of coupling element 30 in positioning device 100 will be discussed below in more detail.

Coupling element 30 has a top side 301 and a bottom side 302 and, for example, is disposed in positioning device 100 in such a way that a mounting surface 3020 at bottom side 302 of coupling element 30 is mounted to first carriage 11A and that a mounting surface 3010 at top side 301 is mounted to second linear guide 20.

More specifically, in order to create the coupling between second linear guide 20 and coupling element 30, it may be provided for coupling element 30 to be mounted to second linear guide 20 only by means of surrounding part 32, but not via central part 31. In FIG. 2 and FIG. 3B, the corresponding mounting surface 3010 of surrounding part 32 that is mounted to second linear guide 20 is highlighted by correspondingly hatched regions and straight arrows, respectively. For this purpose, coupling element 30 is, for example, provided at the respective locations with openings which may be engaged by fastening pins or other fastening means.

Positioning device 100 further includes a receiving element 40 (shown in greater detail in FIG. 4) that is mounted to first carriage 11A and configured to create a coupling to coupling element 30. For example, mounting surface 3020 at bottom side 302 of coupling element 30 couples to first carriage 11A, for example, in such a way that both central part 31 and surrounding part 32 are mounted to receiving element 40. In FIG. 3A, the corresponding mounting surface 3020 of coupling element 30 is highlighted by the three straight arrows.

A top side 401 of receiving element 40 is configured to match the geometry of coupling element 30, and more specifically, to match mounting surface 3020 at bottom side 302 of coupling element 30. Surrounding part 32 connects, for example by central portion 321 and by web-like flanges 324, to correspondingly configured portions 41 and 421 of receiving element 40. Thus, web-like flanges 324 each form a portion of mounting surface 3020 at bottom side 302 and extend, for example, at the same level as the remainder of bottom side 302 of coupling element 30, and therefore the corresponding portions 421 of receiving element 40 are configured adjacent to the step-like raised portions 424 of top side 401. Thus, in accordance with the exemplary embodiment, the entire bottom side 302 of coupling element 30 is recessed slightly deeper into receiving element 40, including end portions 322 and central portion 321 of surrounding part 32 (at portions 421) and central part 31 (at portion 41). Receiving element 40 is provided with a portion 41 for central part 31, which portion 41 is structurally configured to match central part 31 and is, for example, approximately #-shaped in structure.

The length in first linear direction X of the portion of top surface 401 of receiving element 40 that is recessed and bounded by the step-like raised portions 424 is, for example, exactly equal to first overall extent X1 so that coupling element 30, when mounted to top side 401, is stabilized in first linear direction X by step-like raised portions 424, as illustrated in FIG. 5A.

Due to the stepped profile of top side 401 of receiving element 40, considered with respect to linear direction Z, increased stability is achieved with respect to first linear direction X. Thus, central portion 321 of surrounding part 32 as well as the central part 31 of the coupling element 30 are recessed into receiving element 40, whereas the two end portions 322 rest against the surface of the step-like raised portions 424 extending in the linear direction Z.

Bottom side 402 of receiving element 40 is provided with a groove-like recess 403, which is engaged by first carriage 11A, as illustrated in FIGS. 5A-C.

In accordance with the exemplary embodiment shown in FIGS. 5A-C, positioning device 100 includes two outer linear guides 10B' and 10B" that are disposed adjacent and parallel to first linear guide 10A and each guide at least one auxiliary carriage 11B', 10B" (two in the exemplary embodiments shown) along first linear direction X. Guides 10A, 10W and 10B" are mounted to a base structure 50 of positioning device 100.

Second linear guide 20 is coupled to first carriage 11A as well as to the altogether four auxiliary carriages 11B', 11B" and is thus guided along first linear direction X.

As mentioned, first linear guide 10A guides first carriage 11A along first linear direction X. To provide for such guidance, a rail 12A is provided.

The two outer linear guides 10W and 10B" are configured similarly, and, in order to guide auxiliary carriages 11B', 11B", they each include a correspondingly disposed rail 12B', 12B".

Also mounted to base structure 50 are the magnetic tracks 60', 60" of two linear motors. Several possible design variants of a magnetic track for a positioning device of the present construction are known to those skilled in the art, for example from EP 0 793 870 B1.

Second linear guide 20 is coupled to first carriage 11A and to the four auxiliary carriages 11B', 11B". In the embodiment shown, second linear guide 20 is moved along first linear direction X by suitably energizing the linear motors.

In order to couple second linear guide 20 to first carriage 11A, coupling element 30 is provided, which is constructed as described above.

In order to create the coupling between second linear guide 20 and auxiliary carriages 11B', 11B", each of these auxiliary carriages 11B', 11B" has a respective coupling flat spring 70', 70" mounted thereon, each coupling flat spring being disposed in a plane parallel to first linear direction X and to third linear direction Z.

Coupling flat springs 70', 70" create the coupling to second linear guide 20. The coupling of coupling flat springs 70', 70" to second linear guide 20 is configured such that it permits a certain degree of tilting/rotation of second linear guide 20 about third linear direction Z (as an axis of rotation), but prevents tilting/rotation about first linear direction X (as an axis of rotation) and about second linear direction Y (as an axis of rotation).

In accordance with an embodiment of positioning device 100, only a single coupling member 30 is provided to couple second linear guide 20 to first linear guide 10A and guides 10B', 10B". The coupling of second linear guide 20 to auxiliary carriages 11B', 11B" is accomplished via additional coupling elements that are not constructed like coupling element 30, but in a different way, for example in the form of the aforesaid coupling flat springs 70', 70". Coupling flat springs 70', 70" enable positioning device 100 to tolerate, for example, thermally induced expansion of second linear guide 20.

Figure 6:
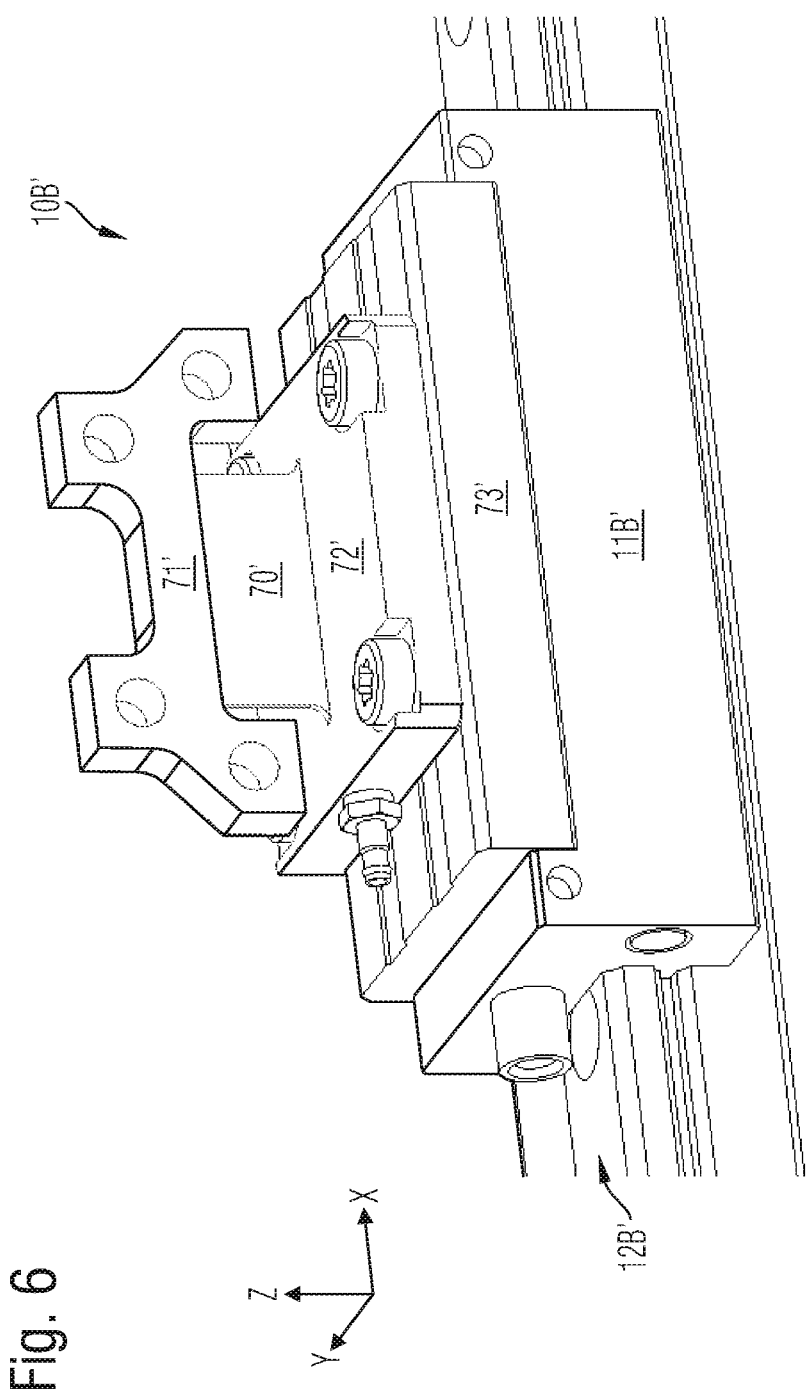

An exemplary embodiment of auxiliary carriages 11B', 11B" is illustrated in FIG. 6. Auxiliary carriage 11B' (the other auxiliary carriages are constructed identically) is equipped with two attachment elements 72' and 73', the uppermost attachment element 72' having the coupling flat spring 70' disposed thereon. Coupling flat spring 70' merges into another coupling means 71', which is adapted for attachment to second linear guide 20.

Referring to FIG. 5C, second linear guide 20 guides second carriage 21 along second linear direction Y. Second carriage 21 is provided with a functional element 28, which is addressed and controlled via, for example, a flexible cord 27. Examples of various functional elements have already been mentioned above. It should be noted here again that the present invention is not limited to a specific functional element or to a specific field of application of positioning device 100.

Provided herein as embodiments of the present invention are not only coupling element 30 and the positioning device 100 equipped with the coupling element, but also a method for manufacturing a coupling element. The method includes: manufacturing, as a single piece, a central part; a surrounding part spaced at a distance from and surrounding the central part and having a first overall extent in the first linear direction and a second overall extent in the second linear direction that is less than the first overall extent; and a plurality of connecting flat springs creating this distance and connecting together the central part and the surrounding part. The method further includes configuring the coupling element to create a coupling between the first carriage and the second linear guide.

Exemplary embodiments of the method for manufacturing the coupling element correspond to the above-described embodiments of the coupling element and the above-described embodiments of the positioning device, and therefore, reference is made to the above description.

The manufacture includes, for example, several machining steps, such as a punching step, a milling step, and the like. In order to configure the coupling element for creating the coupling between the first carriage and the second linear guide, the method includes, for example, forming openings in the surrounding part and in the central part, which openings may be engaged, for example, by fasteners so as to form the aforesaid coupling.

Because of its geometric design, the coupling element 30 described herein has a high stiffness with respect to translational forces along the three linear directions X, Y and Z as well as a high stiffness with respect to rotational forces about first linear direction X (as an axis of rotation) and particularly about second linear direction Y (as an axis of rotation). With regard to the rotational forces about third linear direction Z (as an axis of rotation), coupling element 30 is somewhat flexible to permit a certain degree of rotation/tilting about this axis.

Coupling element 30 makes it possible to provide a positioning device 100 that has a small tilt error (known as Abbe error). This may be further facilitated if coupling element 30 has a third overall extent Z1 (see FIG. 2) in third linear direction Z that is significantly smaller than both first overall extent X1 and second overall extent Y1. Third overall extent Z1 is, for example, no greater than 50% of second overall extent Y1 and no greater than 30% of first overall extent X1. For example, first overall extent X1 is about 146 mm, second overall extent Y1 is about 78 mm, and third overall extent Z1 is about 21 mm.

Coupling element 30 may be made of a stainless steel, as described above, or of another material having a high modulus of elasticity (Young's modulus).

Receiving element 40 may be made of a lightweight material, such as aluminum. As explained, the receiving element provides the mechanical interface between first carriage 11A and coupling element 30.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A coupling element for a positioning device, the positioning device including a first linear guide for guiding a first carriage along a first linear direction and a second linear guide for guiding a second carriage along a second linear direction substantially perpendicular to the first linear direction, the coupling element being configured to create a coupling between the first carriage and the second linear guide, the coupling element comprising:
   a central part;
   a surrounding part spaced at a distance from and surrounding the central part, the surrounding part having a central portion surrounding the central part, and having two end portions adjoining the central portion in the first linear direction;
   a plurality of connecting flat springs creating the distance and connecting together the central part and the central portion of the surrounding part, the connecting flat springs lying in planes which intersect at a center of the central part; and
   a vertical flat spring disposed parallel to the first linear direction at each of the two end portions of the surrounding part,
   wherein:
   a mounting surface at a top side of the coupling element on the surrounding part is configured for coupling to the second linear guide,
   a mounting surface at a bottom side of the coupling element on the central part is configured for coupling to the first carriage, and
   the vertical flat springs each extend from the top side to the bottom side of the coupling element at the surrounding part and merge, at the bottom side, into a respective flange forming a respective additional mounting surface at the bottom side on the surrounding part.

2. The coupling element as recited in claim 1, wherein the planes in which the connecting flat springs are disposed are parallel to a third linear direction, the third linear direction being perpendicular to both the first linear direction and the second linear direction.

3. The coupling element as recited in claim 1, wherein the vertical flat springs lie in planes which intersect at the center of the central part so that the connecting flat springs and the vertical flat springs are configured to allow the surrounding part to tilt about an axis of rotation extending through the center of the central part and parallel to a third linear direction, the third linear direction being perpendicular to both the first linear direction and the second linear direction.

4. The coupling element as recited in claim 1, wherein the flanges are configured to be fixed to the first carriage such that the flanges are not moveable relative to the central part.

5. The coupling element as recited in claim 1, wherein the vertical flat springs are each disposed at least twice as far away from the center of the central part than any of the connecting flat springs.

6. The coupling element as recited in claim 1, wherein the coupling element is monolithically formed.

7. The coupling element as recited in claim 6, wherein the coupling element is formed of a stainless steel.

8. The coupling element as recited in claim 1, wherein the coupling element is manufactured as a single piece.

9. A positioning device comprising:
   a first linear guide configured to guide a first carriage along a first linear direction;
   a second linear guide configured to guide a second carriage along a second linear direction substantially perpendicular to the first linear direction; and
   a coupling element configured to create a coupling between the first carriage and the second linear guide, the coupling element comprising:
   a central part,
   a surrounding part spaced at a distance from and surrounding the central part, the surrounding part having a central portion surrounding the central part, and having two end portions adjoining the central portion in the first linear direction;

a plurality of connecting flat springs creating the distance and connecting together the central part and the central portion of the surrounding part, the connecting flat springs lying in planes which intersect at a center of the central part; and a vertical flat spring disposed parallel to the first linear direction at each of the two end portions of the surrounding part.

10. The positioning device as recited in claim 9, further comprising a receiving element mounted to the first carriage and configured to receive the coupling element.

11. The positioning device as recited in claim 9, wherein the positioning device is a gantry design, and wherein the positioning device further comprises:

two outer linear guides that are disposed adjacent and parallel to the first linear guide, each of the two outer linear guides being configured to guide at least one auxiliary carriage along the first linear direction, the second linear guide being coupled to the auxiliary carriages; and a coupling flat spring mounted on each of the auxiliary carriages in order to create the couplings between the second linear guide and the at least two auxiliary carriages, each of the coupling flat springs being disposed in a plane parallel to the first linear direction and to a third linear direction, the third linear direction being perpendicular to both the first linear direction and the second linear direction.

12. The positioning device as recited in claim 9, wherein:

a mounting surface at a top side of the coupling element on the surrounding part is coupled to the second linear guide;

a mounting surface at a bottom side of the coupling element on the central part is coupled to the first carriage.

13. The positioning device as recited in claim 12, wherein the vertical flat springs each extend from the top side to the bottom side of the coupling element at the surrounding part and merge, at the bottom side, into a respective flange forming a respective additional mounting surface at the bottom side on the surrounding part.

14. The positioning device as recited in claim 13, wherein the flanges are fixed to the first carriage such that the flanges are not moveable relative to the central part.

15. A method for coupling a coupling element to a positioning device, the method comprising:

providing the coupling element comprising:
a central part;
a surrounding part spaced at a distance from and surrounding the central part, the surrounding part having a central portion surrounding the central part, and having two end portions adjoining the central portion in a first linear direction;
a plurality of connecting flat springs creating the distance and connecting together the central part and the central portion of the surrounding part, the connecting flat springs lying in planes which intersect at a center of the central part; and
a vertical flat spring disposed parallel to the first linear direction at each of the two end portions of the surrounding part; and coupling the coupling element to a first carriage of the positioning device and to a second linear guide of the positioning device, the first carriage being guidable by a first linear guide along the first linear direction, and a second carriage being guidable by the second linear guide along a second linear direction substantially perpendicular to the first linear direction.

16. The method as recited in claim 15, wherein the method comprises:

providing that the coupling element includes a mounting surface at a top side of the coupling element on the surrounding part is coupled to the second linear guide; and providing that the coupling element includes a mounting surface at a bottom side of the coupling element on the central part is coupled to the first carriage.

17. The method as recited in claim 16, wherein the method comprises providing that the coupling element includes the vertical flat springs each extending from the top side to the bottom side of the coupling element at the surrounding part and merging, at the bottom side, into a respective flange forming a respective additional mounting surface at the bottom side on the surrounding part.

18. The method as recited in claim 17, wherein the method comprises providing that the coupling element includes the flanges being fixed to the first carriage such that the flanges are not moveable relative to the central part.

\* \* \* \* \*